(12) United States Patent
Arimura

(10) Patent No.: US 10,680,108 B2
(45) Date of Patent: Jun. 9, 2020

(54) FIELD-EFFECT TRANSISTOR COMPRISING GERMANIUM AND MANUFACTURING METHOD THEREOF

(71) Applicant: IMEC VZW, Leuven (BE)

(72) Inventor: Hiroaki Arimura, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/367,650

(22) Filed: Dec. 2, 2016

(65) Prior Publication Data
US 2017/0162686 A1 Jun. 8, 2017

(30) Foreign Application Priority Data

Dec. 4, 2015 (EP) .................................. 15197983

(51) Int. Cl.
| | |
|---|---|
| *H01L 29/78* | (2006.01) |
| *H01L 29/66* | (2006.01) |
| *H01L 21/28* | (2006.01) |
| *H01L 29/423* | (2006.01) |
| *H01L 29/51* | (2006.01) |
| *H01L 29/49* | (2006.01) |

(Continued)

(52) U.S. Cl.
CPC .......... *H01L 29/785* (2013.01); *H01L 21/285* (2013.01); *H01L 21/28255* (2013.01); *H01L 21/324* (2013.01); *H01L 29/0649* (2013.01); *H01L 29/16* (2013.01); *H01L 29/42392* (2013.01); *H01L 29/4966* (2013.01); *H01L 29/512* (2013.01); *H01L 29/513* (2013.01); *H01L 29/517* (2013.01); *H01L 29/66545* (2013.01); *H01L 2029/7858* (2013.01)

(58) Field of Classification Search
CPC ....... H01L 29/78; H01L 29/785; H01L 21/28; H01L 21/285; H01L 21/324; H01L 29/66; H01L 29/66545

USPC .......................................................... 257/401
See application file for complete search history.

(56) References Cited

U.S. PATENT DOCUMENTS 8,319,295 B2 * 11/2012 Collaert ............ H01L 21/28079
257/411
8,558,282 B1 * 10/2013 Cai ...................... H01L 29/6625
257/197

(Continued)

OTHER PUBLICATIONS

Groeseneken et al., "BTI reliability of advanced gate stacks for Beyond-Silicon devices: challenges and opportunities", *IEEE*, 2014, 4 pages.

*Primary Examiner* — Fazli Erdem

(74) *Attorney, Agent, or Firm* — Knobbe, Martens, Olson & Bear, LLP

(57) ABSTRACT

The disclosed technology generally relates to semiconductor devices, and more particularly to transistors comprising germanium (Ge) in the channel, and to methods of manufacturing thereof. In one aspect, a field-effect transistor (FET) comprises an active region comprising germanium (Ge) and a gate stack formed on the active region. The gate stack comprises a Si-comprising passivation layer formed on the active region, an interfacial dielectric layer comprising $SiO_x$ (x>0) formed on the passivation layer, a dielectric capping layer comprising an interface dipole-forming material formed on the interfacial dielectric layer, a high-k dielectric layer formed on the dielectric capping layer and a gate electrode layer formed on the high-k dielectric layer.

24 Claims, 11 Drawing Sheets

(51) Int. Cl.
*H01L 21/285* (2006.01)
*H01L 21/324* (2006.01)
*H01L 29/06* (2006.01)
*H01L 29/16* (2006.01)

(56) References Cited

U.S. PATENT DOCUMENTS

| | | | |
|---|---|---|---|
| 9,425,277 B2 * | 8/2016 | Grupp | H01L 21/28537 |
| 9,666,487 B2 * | 5/2017 | Lin | H01L 21/823807 |
| 2007/0045610 A1 * | 3/2007 | Lee | H01L 29/1054 |
| | | | 257/19 |
| 2008/0029790 A1 * | 2/2008 | Ahn | H01L 21/28255 |
| | | | 257/288 |
| 2010/0065824 A1 * | 3/2010 | Wang | H01L 21/28176 |
| | | | 257/24 |
| 2010/0213477 A1 * | 8/2010 | Xu | H01L 33/0041 |
| | | | 257/94 |
| 2011/0084309 A1 * | 4/2011 | Kaczer | H01L 29/1054 |
| | | | 257/192 |
| 2011/0127618 A1 * | 6/2011 | Scheiper | H01L 29/165 |
| | | | 257/402 |
| 2013/0105905 A1 * | 5/2013 | Ji | H01L 21/28202 |
| | | | 257/369 |
| 2014/0061819 A1 * | 3/2014 | Brodsky | H01L 21/28255 |
| | | | 257/392 |
| 2014/0183651 A1 * | 7/2014 | Lee | H01L 21/823857 |
| | | | 257/369 |
| 2015/0104933 A1 * | 4/2015 | Tsai | H01L 21/02345 |
| | | | 438/482 |
| 2015/0129973 A1 * | 5/2015 | Ji | H01L 27/0922 |
| | | | 257/369 |
| 2015/0221559 A1 * | 8/2015 | Kang | H01L 21/823842 |
| | | | 257/369 |
| 2016/0190286 A1 * | 6/2016 | Wang | H01L 29/66795 |
| | | | 438/283 |
| 2018/0040723 A1 * | 2/2018 | Chan | H01L 29/1008 |

* cited by examiner

FIELD-EFFECT TRANSISTOR COMPRISING GERMANIUM AND MANUFACTURING METHOD THEREOF

CROSS-REFERENCE TO RELATED APPLICATIONS

This application claims foreign priority to European Patent Application No. EP 15197983.8, filed Dec. 4, 2015, the content of which is incorporated by reference herein in its entirety.

BACKGROUND

Field

The disclosed technology generally relates to semiconductor devices, and more particularly to transistors comprising germanium (Ge) in the channel, and to methods of manufacturing thereof.

Description of the Related Technology

In the path of continued physical scaling of metal-oxide-semiconductor (MOS) devices, one of both of gate dielectrics comprising $SiO_2$ and gates comprising polysilicon are replaced by a high-k dielectric and a metal gate, respectively. While the integration of high-k dielectric and/or metal gate in MOS devices enables the continued physical scaling of the MOS devices, challenges associated with their integration have been identified, e.g., flat band voltage and/or threshold voltage shifts, increased gate leakage, mobility degradation and bias temperature instability (BTI), to name a few.

In particular, bias temperature instability (BTI), e.g., negative-bias temperature instability (NBTI) or positive-bias temperature instability (PBTI), has been identified as a critical issue which limits the device reliability, e.g., for Si-based metal oxide semiconductor field-effect-transistors (MOSFETs) having sub 1-nanometer equivalent oxide thickness (EOT). The non-ideal behavior of MOSFETs due to BTI is has been proposed to be caused by defects at the interface between the semiconductor channel and the gate dielectric layer, as well as bulk defects formed within the gate dielectric layer itself.

At the same time, the use of high mobility channel materials are being considered for further device performance enhancement in future device technology nodes. For example, Germanium (Ge) has been proposed as a possible channel material for increased mobility in n-type MOSFETs. In "BTI reliability of advanced gate stacks for Beyond-Silicon devices: challenges and opportunities" by G. Groeseneken et al. in Electron Devices Meeting (IEDM), 2014 IEEE International, pages 34.4.1-34.4.4, BTI in Si and (Si)Ge based sub 1-nanometer equivalent oxide thickness (EOT) MOSFET devices have been reviewed. The article discloses improved BTI reliability for Ge based devices having a gate stack comprising a relatively thick silicon (Si) passivation layer (1 nm or thicker) formed between the Ge-channel layer and a high-k gate dielectric layer (Ge/Si-cap/$SiO_2$/$HfO_2$) for both pMOS and nMOS devices. For pMOS Ge/Si-cap/$SiO_2$/$HfO_2$ devices NBTI reliability is good to excellent, whereas for nMOS Ge/Si-cap/$SiO_2$/$HfO_2$ devices PBTI reliability is sufficient. On the other hand, simulations have suggested that the Si passivation layer needs to be thinned down to a few monolayers (MLs) to obtain the high electron mobility for Ge.

Thus, there is a need for transistors having improved performance and mobility, while also having improved BTI reliability compared to prior art transistors.

SUMMARY OF CERTAIN INVENTIVE ASPECTS

It is an object of particular embodiments of the disclosed technology to provide transistors having high performance, high mobility and excellent BTI reliability.

It is another object of embodiments of the disclosed technology to provide methods for manufacturing transistors having high performance, high mobility and excellent BTI reliability.

The above objectives are accomplished by a device and method according to embodiments of the disclosed technology.

Particular and preferred aspects of the invention are set out in the accompanying independent and dependent claims. Features from the dependent claims may be combined with features of the independent claims and with features of other independent claims as appropriate and not merely as explicitly set out in the claims.

A first inventive aspect relates to a field-effect transistor (FET). The FET comprises an active region comprising germanium (Ge); and a gate stack on the active region. The gate stack comprises a passivation layer comprising Si; on the passivation layer an interfacial dielectric layer comprising $SiO_x$ with x being an integer greater than 0; on the interfacial dielectric layer a dielectric capping layer comprising an interface dipole-forming material; on the dielectric capping layer a high-k dielectric layer; on the high-k dielectric layer a gate electrode layer.

It is an advantage that the FET according to the disclosed technology has excellent mobility and BTI reliability properties. More specifically the FET has excellent electron mobility and PBTI reliability.

It is an advantage that the FET according to embodiments of the disclosed technology has an improved subthreshold slope (SS) in comparison with prior art FET devices.

According to embodiments of the first inventive aspect, the dielectric capping layer is in physical contact with the interfacial dielectric layer and the high-k dielectric layer. The dielectric capping layer is thus sandwiched in between the interfacial dielectric layer and the high-k dielectric layer.

According to embodiments of the first inventive aspect, the interface dipole-forming material comprises a material inducing a negative shift of the threshold voltage independent of the thickness of the dielectric capping layer. More specifically the interface dipole-forming material is selected from any of lanthanum (La), yttrium (Y), magnesium (Mg), erbium (Er), dysprosium (Dy), gadolinium (Gd) or another rare earth material.

According to embodiments of the first inventive aspect, the dielectric capping layer is a transition metal oxide layer or a transition metal silicate layer.

According to embodiments of the first inventive aspect, the dielectric capping layer is an atomic layer deposition (ALD) or physical vapor deposition (PVD) layer.

According to embodiments of the first inventive aspect, the PVD dielectric capping layer comprises a stoichiometric or a sub-stoichiometric lanthanum oxide, e.g., $La_xO_z$, where x, z are numbers, e.g., integers, greater than 0.

According to embodiments of the first inventive aspect, the ALD dielectric capping layer comprises a stoichiometric or a sub-stoichiometric lanthanum oxide, e.g., $La_xO_z$, or a stoichiometric or a sub-stoichiometric lanthanum silicate, e.g., $La_xSi_yO_z$, where with x, y and z numbers, e.g., integers, greater than 0.

It is an advantage that the FET according to embodiments of the disclosed technology is compatible with three dimensional (3D) device integration.

According to embodiments, the PVD or ALD dielectric capping layer comprises $La_2O_3$. For very thin layers, oxygen may be even less for example LaO. According to embodiments, the ALD dielectric capping layer comprises LaSiO or $LaSiO_2$. $La_2Si_7$ is another possible crystal structure for $La_xSi_yO_z$.

According to embodiments of the first inventive aspect the thickness of the passivation layer is between 1 and 8 monolayers.

According to embodiments of the first inventive aspect the high-k material is chosen from any of a stoichiometric or a sub-stoichiometric $HfO_x$, $HfSiO_x$, HfSiON, $LaO_x$, $ZrO_x$, $ZrSiO_x$, $TaO_x$, $AlO_x$ or any combination made thereof.

According to embodiments of the first inventive aspect the gate electrode comprises a metal chosen from a stoichiometric or a sub-stoichiometric TiN, TiAl, TaN, TaC, TiC, Ti, Ta, Mo, Ru or W or any combination made thereof.

According to embodiments of the first inventive aspect the interfacial dielectric layer comprises $SiO_2$ and the dielectric capping layer comprises $La_2O_3$ or LaSiO or $LaSiO_2$;

According to embodiments of the first inventive aspect the FET is a FinFET or a GAA FET.

A second inventive aspect relates to a method of manufacturing a field-effect transistor (FET) the method comprising the steps of providing an active region comprising germanium (Ge); providing a gate stack on the active region comprising: providing on the active region a passivation layer comprising Si; providing on the passivation layer an interfacial dielectric layer comprising SiOx with x being an integer greater than 0; providing on the interfacial dielectric layer a dielectric capping layer comprising an interface dipole-forming material; providing on the dielectric capping layer a high-k dielectric layer; providing on the high-k dielectric layer a gate electrode layer.

According to embodiments of a second inventive aspect the dielectric capping layer is provided by physical vapor deposition (PVD) or by atomic layer deposition (ALD).

According to embodiments of a second inventive aspect, providing a passivation layer comprises providing the passivation layer with a thickness of 1 to 8 monolayers.

According to embodiments of a second inventive aspect, the interfacial dielectric layer is formed by oxidizing part of the passivation layer.

According to embodiments of a second inventive aspect, the method further comprises performing a laser anneal after providing the high-k dielectric layer.

According to embodiments of a second inventive aspect, the manufacturing method is a gate-last manufacturing method.

It is an advantage that FETs according to embodiments of the disclosed technology have high mobility and good BTI reliability, more specifically high electron mobility and good PBTI reliability It is an advantage that FETs according to embodiments of the disclosed technology may be used for three dimensional (3D) device integration.

It is an advantage that FETs according to embodiments of the disclosed technology have low threshold voltage.

BRIEF DESCRIPTION OF THE DRAWINGS

The invention will now be described further, by way of example, with reference to the accompanying drawings. All figures are intended to illustrate some aspects and particular embodiments of the disclosed technology. The figures are depicted in a simplified way for reason of clarity. Not all alternatives and options are shown and therefore the invention is not limited to the content of the given drawings. Like numerals are employed to reference like parts in the different figures.

All drawings are intended to illustrate some aspects and embodiments of the disclosed technology. The drawings described are only schematic and are non-limiting.

DETAILED DESCRIPTION OF CERTAIN ILLUSTRATIVE EMBODIMENTS

Figure 1:
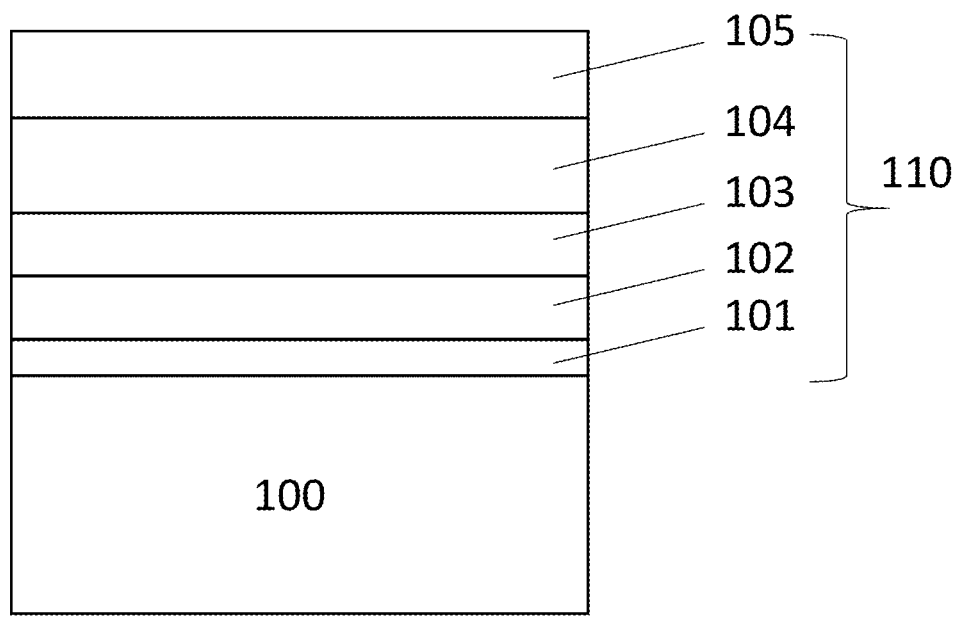
FIG. 1 schematically illustrates a FET according to a first inventive aspect.

The disclosed technology will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the term top and the like in the description and the claims are used for descriptive purposes and not necessarily for describing relative positions. It is to be understood that the terms so used are interchangeable under appropriate circumstances and that the particular embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary particular embodiments, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that particular embodiments may be practiced without these specific details. In other instances, well-known methods, structures and techniques have not been shown in detail in order not to obscure an understanding of this description.

The invention will now be described by a detailed description of several particular embodiments. It is clear that other particular embodiments can be configured according to the knowledge of persons skilled in the art without departing from the technical teaching of the invention as defined by the appended claims.

The terms "high-k dielectric" or "high-k material" as used herein refer to a dielectric material having a dielectric constant, k, which is higher than the dielectric constant of $SiO_2$, that is, k>3.9 (or often also the dielectric constant of $SiO_2$ is rounded as being 4). High-k dielectric materials allow for a larger physical thickness, when compared to $SiO_2$, for obtaining the same effective capacitance as can be obtained with a much thinner $SiO_2$ layer.

The term "k-value" as used herein refers to the dielectric constant of the dielectric material, and can be expressed as a high k-value or a low k-value when referring respectively to dielectric materials having high and low k-values.

As schematically shown in FIG. 1, the FET comprises a semiconductor substrate 100 comprising an active region comprising germanium (Ge). The term "substrate" is used to define generally the elements for layers that underlie a layer or portions of interest. Also, the "substrate" may be any other base on which a layer is formed, for example a glass or metal layer. Accordingly a substrate may be a wafer such as a blanket wafer or may be a layer applied to another base material, e.g. an epitaxial layer grown onto a lower layer. The semiconductor substrate may be for example a Ge substrate or an germanium on insulator (GOI) substrate. The semiconductor substrate may be for example a silicon (Si) based substrate comprising a Ge layer. The Ge comprising part of the semiconductor substrate serves as the active region of the FET. The Ge comprising part of the semiconductor substrate may thus for example serve as a channel region of the FET and/or a source and/or drain region of the FET. The disclosure will now be further described for a n-type doped Ge-based semiconductor device.

The FET further comprises a gate stack 110 on the semiconductor substrate 100, more specifically on the Ge-comprising channel layer of the FET. The gate stack 110 comprises a stack of layers: a passivation layer 101, an interfacial dielectric layer 102, a dielectric capping layer 103, a high-k dielectric layer 104 and a metal layer 105.

The FET is preferably manufactured using a so-called gate-last or replacement gate (RMG) process. In a gate-last process, during the manufacturing of the FET device, the metal gate layer 105 or any portion of the gate stack 110 is first formed using a sacrificial structure and later replaced by the final metal gate layer 105 or any portion of the gate stack 110. For example, a gate stack including a dummy or sacrificial gate is first formed, followed by a thermal cycle, e.g., a source/drain anneal, followed by a replacement process in which at least the sacrificial gate is replaced by a final gate layer 105, thereby avoiding an undesirable thermal cycle on the metal gate or any portion of the gate stack 110. In some embodiments, the passivation layer 101 is provided after dummy gate removal and pre-cleaning to remove a sacrificial dielectric, e.g., silicon oxide. However, embodiments are not so limited and the FET may also be manufactured using a so-called gate-first process, in which annealing/doping steps are performed after gate stack formation.

Figure 12A:
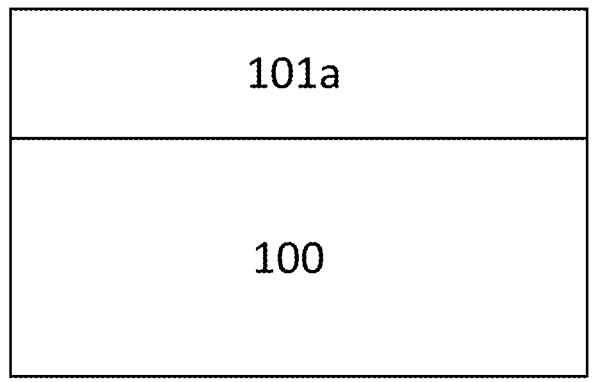
FIGS. 12A-12B schematically illustrates a manufacturing process of the passivation layer and interfacial dielectric layer, according to embodiments of the disclosed technology
Figure 12B:
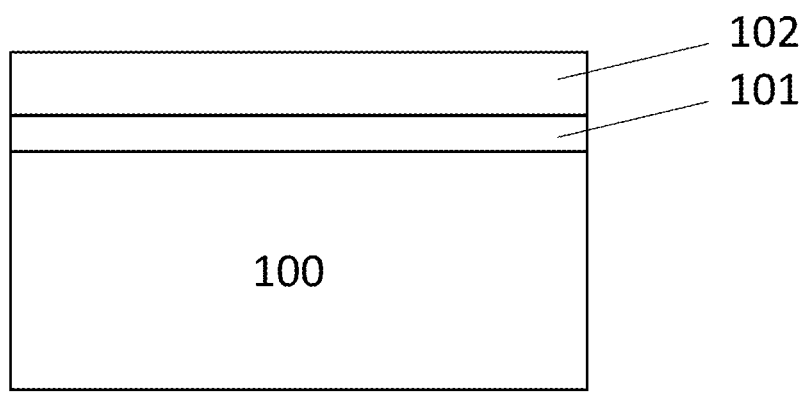
Figure 13:
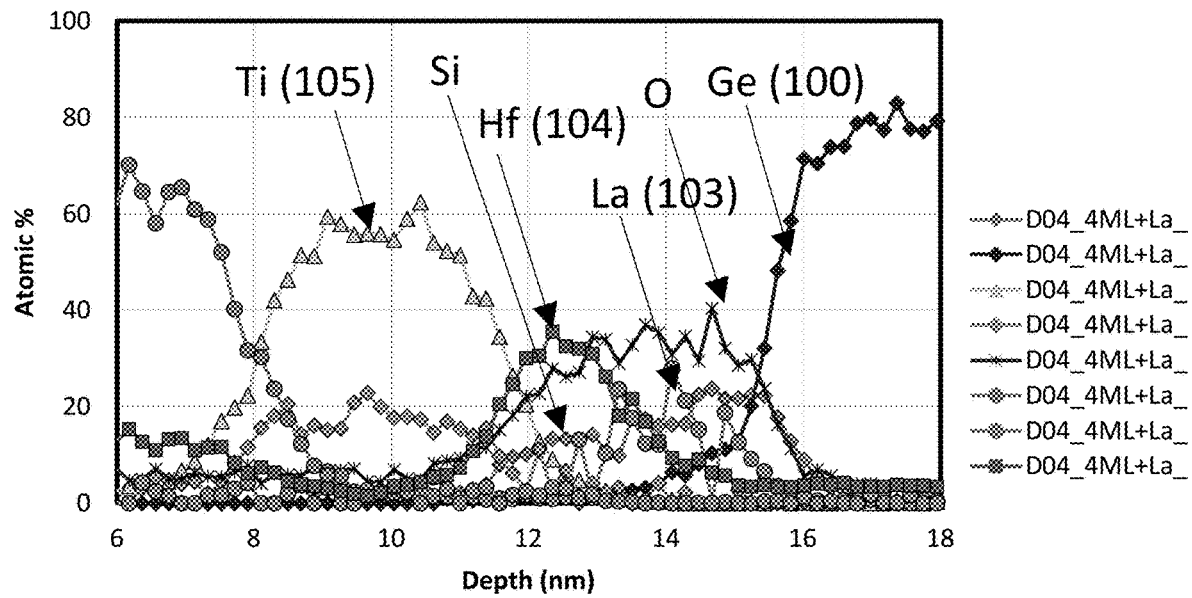
FIG. 13 shows Energy-dispersive X-ray spectroscopy (ESD) measurements for a gate stack, according to embodiments of the disclosed technology.
Figure 14:
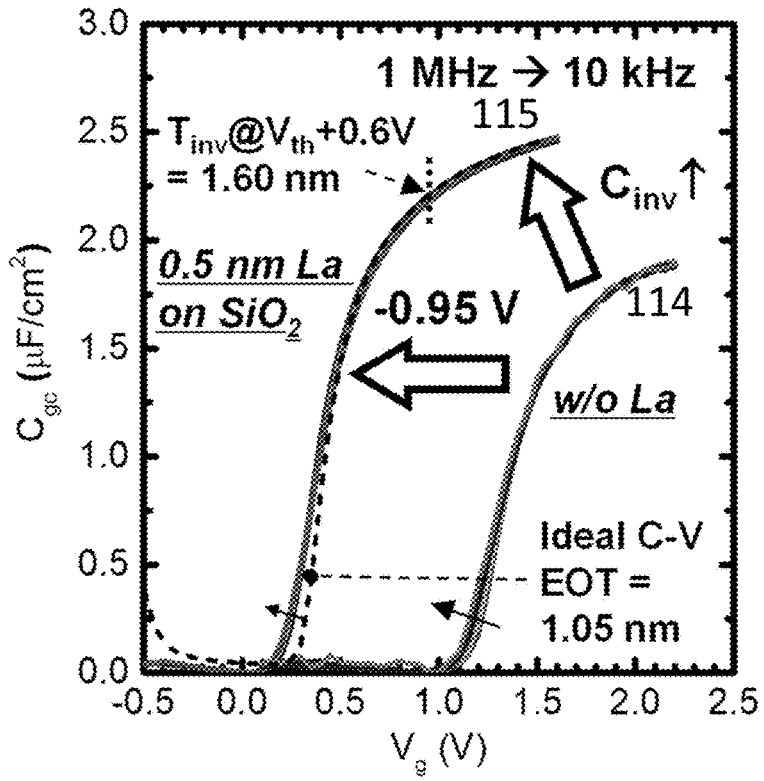
FIG. 14 shows C-V curve for a gate stack, according to embodiments of the disclosed technology.
Figure 15:
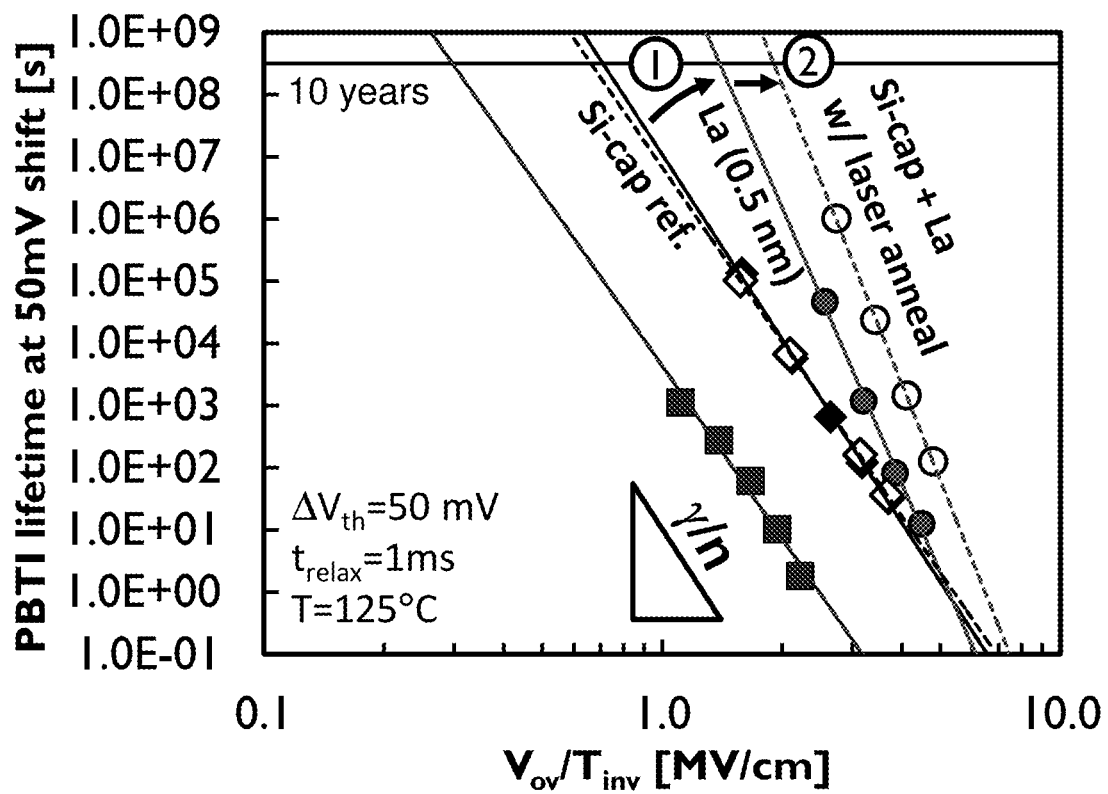
FIG. 15 shows PBTI reliability experimental results for a FET, according to embodiments of the disclosed technology.

The passivation layer 101 comprises Si. The passivation layer 101 may be provided using epitaxial deposition techniques such as for example vapor phase epitaxy (VPE). In some embodiments, the passivation layer 101 is only a few monolayers thick, more specifically between 1 monolayer and 8 monolayers or fewer, which corresponds to a thickness between about 1 angstrom (Å) to about 10 Å or less. Without being bound to any convention, one monolayer of Si is may be about 0.13125 nm in thickness. For example, the passivation layer 101 may be between 1 and 5 monolayers. It should be noted that the thickness of the as-deposited Si layer is larger than the final thickness of the passivation layer 101 in the FET as is shown schematically in FIGS. 12A-12B. By performing an oxidation step after the epitaxial deposition of the passivation layer, part of the as-deposited Si layer is oxidized (for example using dry ozone oxidation) thereby forming an interfacial layer of $SiO_x$ or $SiO_2$ on the passivation layer. The as-deposited Si layer (which will form the passivation layer) is thus partly consumed and modified into $SiO_x$ or $SiO_2$. FIG. 12A shows the intermediate gate stack after depositing the passivation layer, i.e. the as-deposited layer 101a. FIG. 12B shows the intermediate gate stack after oxidation of the as-deposited layer thereby forming the passivation layer 101 and the interfacial dielectric layer 102.

Figures 2A, 2B, 2C:
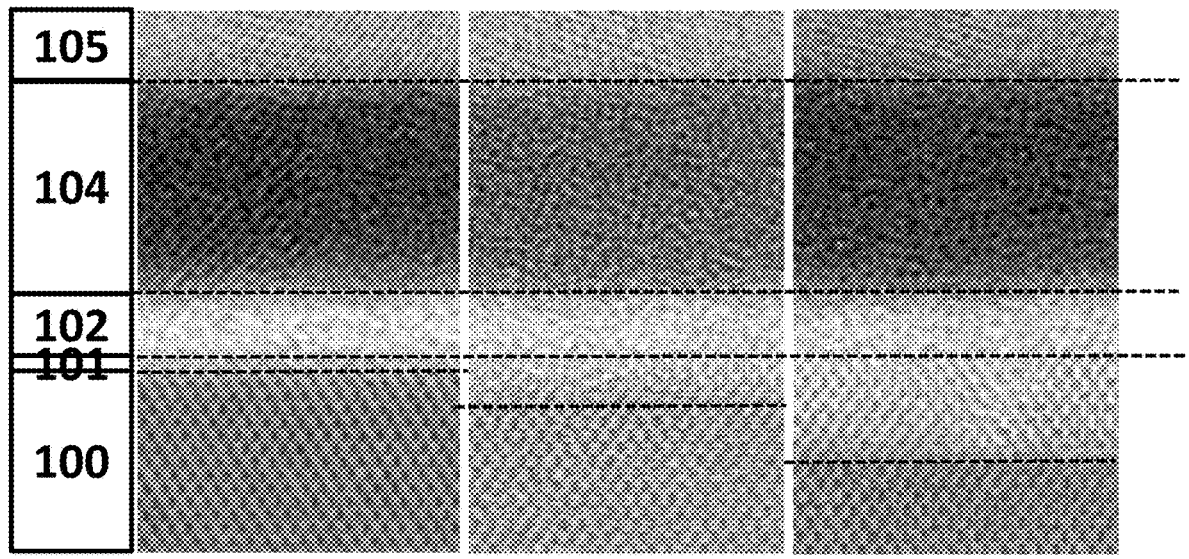
FIGS. 2A-2C show high-resolution transmission electron microscopy (HR-TEM) images of gate stacks comprising a passivation layer and dielectric capping layer formed at different deposition times, according to embodiments of the disclosed technology.

FIGS. 2A-2C show high resolution transmission electron microscopy (HR-TEM) images of gate stacks comprising a Si passivation layer 101, a $SiO_2$ layer 102, a $HfO_2$ layer 104 and TiN metal layer 105, wherein the Si passivation layer 101 is formed with different Si deposition times being 1100 seconds (FIG. 2A), 1650 seconds (FIG. 2B) and 3500 seconds (FIG. 2C). For the different deposition times (and after the oxidation step) a 1.1 nm $SiO_2$ layer is observed. For the deposition time of 1100 seconds (FIG. 2A) a 0.4 nm thick remaining Si layer is observed. By converting the $SiO_2$ thickness (the interfacial layer thickness) into the Si thickness (the passivation layer thickness), the initially grown or as-deposited Si thickness is estimated, indicating that a 0.9 nm thick as-deposited Si layer results in a 0.4 nm thick remaining Si passivation layer which is about 3 monolayers, representing a reduction in the thickness of the as-deposited Si passivation layer by more than 50%, e.g., about 50%-60%. For FIG. 2B the Si passivation layer is about 6 monolayers which is equal to about 0.8 nm and for FIG. 2C the Si passivation layer is about 12 monolayers which is equal to about 1.8 nm.

Figure 3:
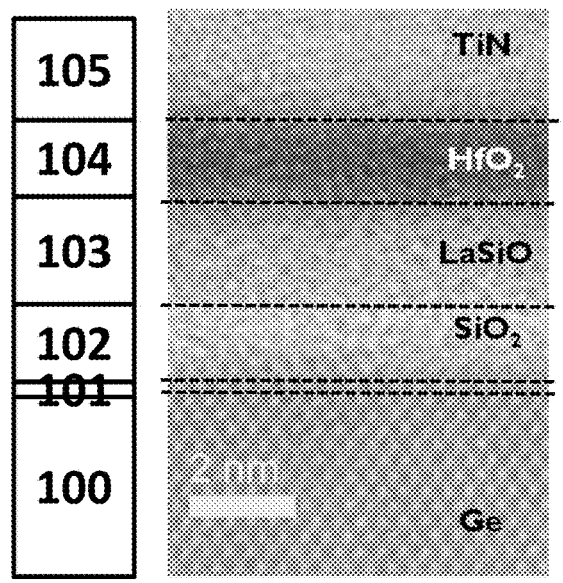
FIG. 3 shows a HR-TEM images of gate stack of a FET, according to embodiments of the disclosed technology.

FIG. 3 shows a HR-TEM image of a gate stack according to embodiments of the disclosed technology. The gate stack comprises a Si passivation layer 101, a $SiO_2$ layer 102, a LaSiO layer, a $HfO_2$ layer 104 and TiN metal layer 105. The as deposited Si thickness is 0.9 nm and the PVD as-deposited La layer is 0.5 nm. After deposition of the Si passivation layer, part is oxidized thereby forming a $SiO_2$ interfacial dielectric layer and after deposition of the PVD La layer diffusion with the underlying layer occurs thereby forming a LaSiO layer on $SiO_2$.

In various embodiments, the remaining passivation layer is reduced down to a few monolayers, e.g., between 1 and 8 monolayers or less, e.g., between 1 and 5 monolayers, in order to obtain the high electron mobility of Ge. In these embodiments, without being bound to any theory, the electrons are distributed in the Ge channel due to quantization and limited physical thickness of the Si passivation layer. According to embodiments, Si thickness can be thus between 1 and 8 monolayers or less, e.g., between 1 and 5 monolayers. The criticality of the passivation layer material (e.g., comprises Si) and the thickness of the passivation layer, as well as the criticality of the combination between the passivation layer and the material and composition of the dielectric capping layer, is illustrated below, e.g., with respect to FIGS. 4-15.

According to embodiments the electron mobility of Ge may be further improved by reducing the thickness of the high-k dielectric layer 104 and by using a $H_2$ sintering anneal on the gate stack with optimum Si thickness.

Figure 4:
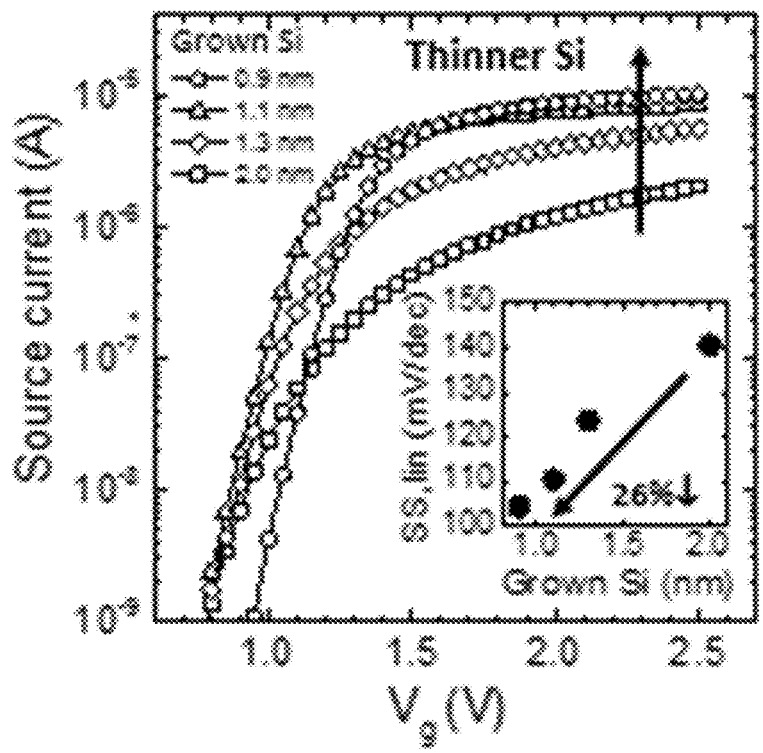
FIG. 4 shows experimental results of the subthreshold slope (SS) for passivation layers, according to embodiments of the disclosed technology.

FIG. 4 shows the increase in subthreshold slope (SS) for different thicknesses of the passivation layer 101. The subthreshold slope is improved by 26% when reducing the thickness of the Si passivation layer from 1.6 nm to 0.8 nm (see inset). Both the on-current $I_{on}$ and electron mobility show a significant increase by using a thinner Si passivation layer. This increase may be qualitatively explained by quantization driven electron distribution, due to which more electrons are distributed in the Ge channel.

Figure 5:
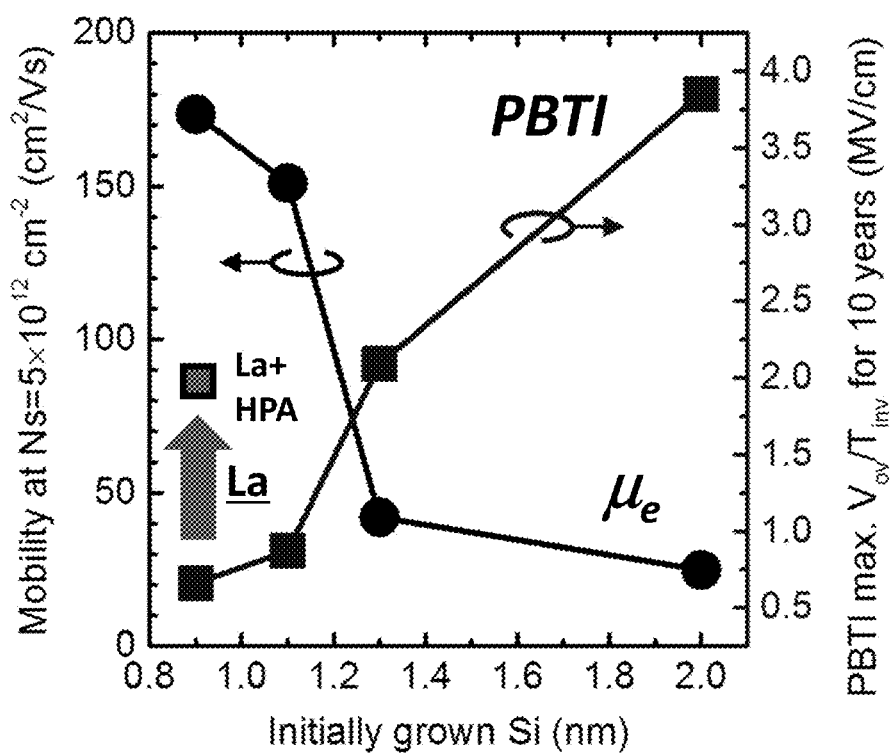
FIG. 5 shows experimental results of the electron mobility and PBTI as a function of the as-deposited thickness of a passivation layer, according to embodiments of the disclosed technology.
Figures 6A, 6B:
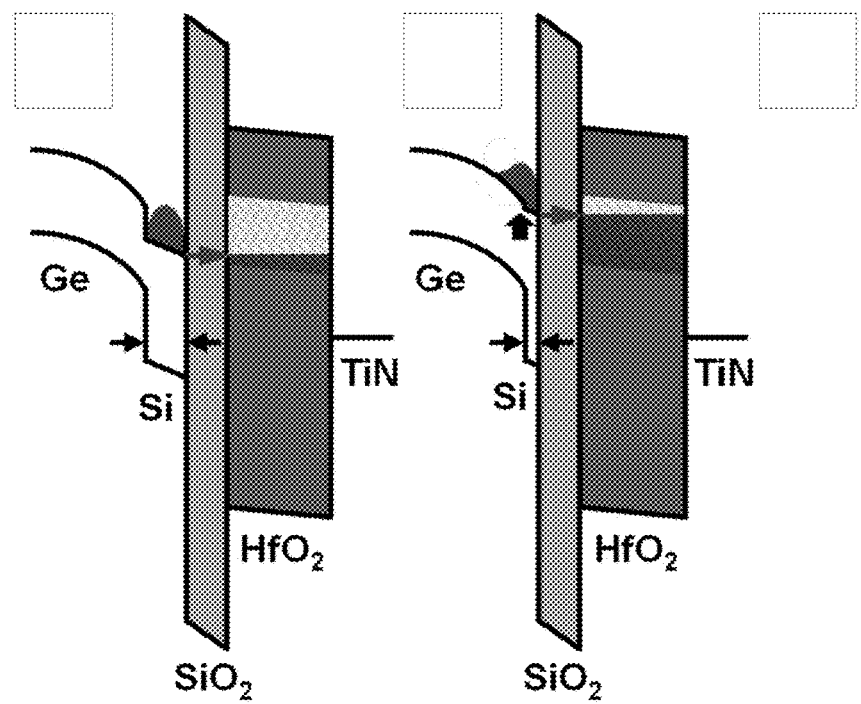
FIGS. 6A-6B schematically shows band diagrams for a FET comprising a passivation layer, according to embodiments of the disclosed technology.
Figure 7:
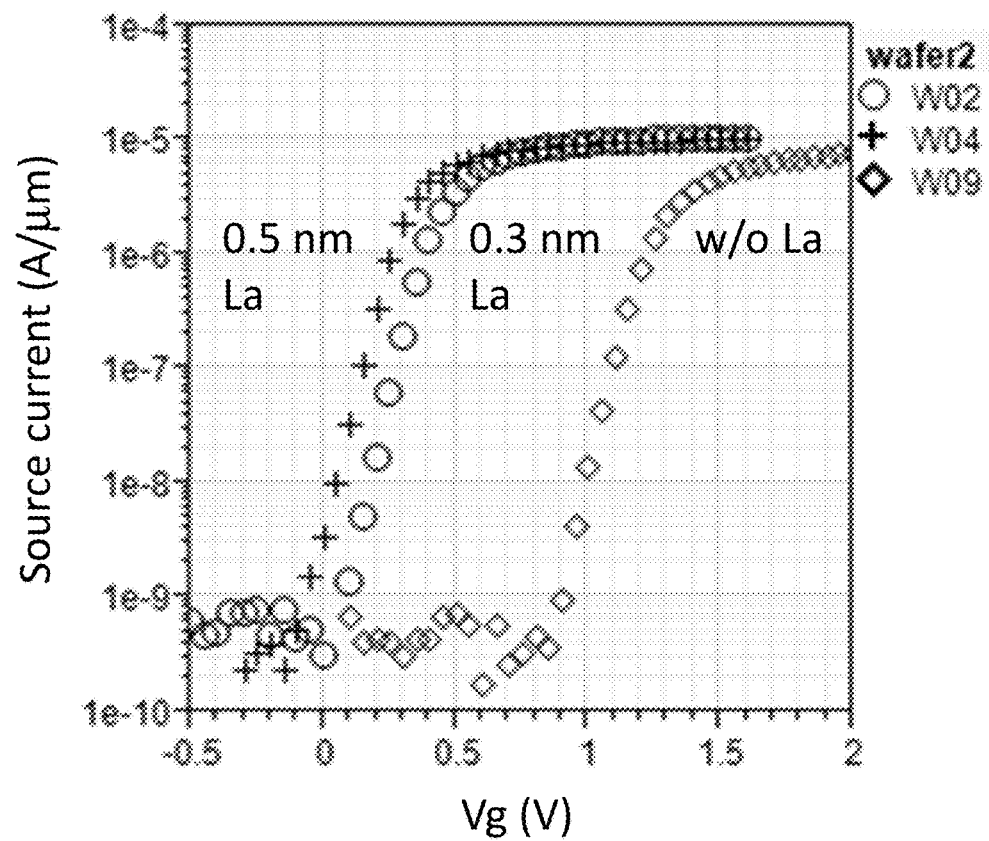
FIG. 7 shows experimental results of the source current versus gate voltage for a FET comprising a dielectric capping layer comprising La, according to embodiments of the disclosed technology.

FIG. 5 shows experimental results of the electron mobility and PBTI as a function of the as-deposited thickness of the passivation layer. Without being bound to any theory, FIG. 6 schematically explains the physical principle behind this relationship for a thick passivation layer (FIG. 6A) and a passivation layer having a thickness according to embodiments of the disclosed technology (FIG. 6B).

It will be appreciated that, when a relatively thick Si passivation layer is used (e.g., being thicker than 1 to 8 monolayers according to the disclosed technology), electrons tend to be more localized in the Si layer, which results in lower electron mobility. On the other hand, the electrons "see" limited part of the defect level in the high-k dielectric layer, thereby resulting in a relatively better PBTI reliability. On the other hand, under configurations having a relatively thin Si passivation layer according to embodiments of the disclosed technology, electrons become less localized in the Si layer and increasingly reside in the Ge channel layer, resulting in a higher electron mobility. On the other hand, the electrons "see" less of the defect levels in the high-k dielectric layer, thereby resulting in poorer PBTI reliability (compared to thicker Si layer). That is, while having an ultrathin (e.g., 1 to 8 monolayers) Si passivation layer improves electron mobility, the PBTI reliability may be degraded compared to having relatively thick (e.g., greater than 8 monolayers) Si passivation layer. In the following, improving the PBTI reliability using other features of the embodiments are described.

Without being bound to any theory, the PBTI reliability can improved when the defect level in the high-k dielectric layer 104 is energetically decoupled by creating an interface dipole between the high-k dielectric layer 104 and the interfacial dielectric layer 102. The inventors have recognized that this advantage is realized when the interfacial dielectric layer 102 contains sufficiently low density of electron trap sites. Accordingly, having the interfacial layer 102 that is formed of a silicon oxide is advantageous over, e.g., having an interfacial layer comprising $GeO_{z>0}$, which can have higher levels of higher density of electron trap sites under some circumstances. The passivation layer 101 may alternatively comprise, for example, SiON, which may be formed by nitriding a thermally grown $SiO_2$ layer formed as interfacial dielectric layer 102. In summary, having an ultrathin passivation layer 101 leads to the advantage of improved electron mobility and improved PBTI.

The FET further comprises a dielectric capping layer 103 comprising an interface dipole-forming material, which is a material for inducing an interface dipole between the interfacial dielectric layer 102 and the high-k dielectric layer 104. Without being bound to any theory, when present, the dielectric capping layer 103 comprising the interface dipole-forming material causes a negative $V_{th}$ shift, which is independent of the thickness of the dielectric capping layer. The interface dipole-forming material may comprise a lanthanide element, e.g., La, Mg, Sc, Y, Sr, Er, Dy, or Gd. The dielectric capping layer 103 is in physical contact with the underlying interfacial dielectric layer 102, according to embodiments. The as-deposited dielectric capping layer may be formed using deposition techniques such as, for example, physical vapor deposition (PVD) or atomic layer deposition (ALD).

In some embodiments, e.g., for FETs in which the dielectric capping layer 103 is deposited using PVD techniques, diffusion of a rare earth metal element(s) may occur, e.g., diffusion of La into the underlying interfacial dielectric layer comprising $SiO_x$ or $SiO_2$ during subsequent high temperature processes, e.g., source/drain anneal. After the diffusion, the as-formed final dielectric capping layer (thus after the complete gate stack processing) may comprise $La_xSi_yO_z$ (with x, y, z>0). Due to this diffusion process, the thickness of the interfacial dielectric layer may be reduced. As a result, the thickness of the interfacial dielectric layer after depositing the dielectric capping layer may be smaller than the thickness of the interfacial dielectric layer before depositing the dielectric capping layer. Energy-dispersive X-ray spectroscopy (ESD) measurements (FIG. 13) reveal the formation of LaSiO on a reduced interfacial dielectric layer ($SiO_2$ layer) for the case of La after the complete device processing of the gate stack 110.

In some embodiments, incorporation of a dielectric capping layer comprising interface dipole-forming material in the gate stack has the advantage that the threshold voltage of the FET is reduced compared to a gate stack without such a dielectric capping layer. This is experimentally shown in FIG. 7 for PVD as-deposited La-layer with a thickness of 0.3 nm, 0.5 nm in comparison with a gate stack without a dielectric layer comprising an interface dipole-forming material (e.g., without La). A decrease in the threshold voltage may be seen for the gate stack comprising a dielectric capping layer comprising La. The frequency dispersion in the C-V curve is also suppressed by the incorporation of La into the gate stack (seen by the shift of the C-V curve 114 for a gate stack without La to the C-V curve 115 for a gate stack with La as indicated by the arrows in FIG. 14), which indicates an improved interface quality at the interface between the passivation layer and the interfacial dielectric layer.

Without being bound to any theory, due to the incorporation of a dielectric capping layer comprising an interface dipole-forming material, the PBTI reliability is improved due to the energetically misaligned electrons in the channel region and the defect level in the high-k dielectric layer. Moreover it is shown that even at thinner $T_{inv}$, the electron mobility is maintained due to the improved interface quality after the incorporation of the interface dipole-forming material.

Figures 8A, 8B, 8C:
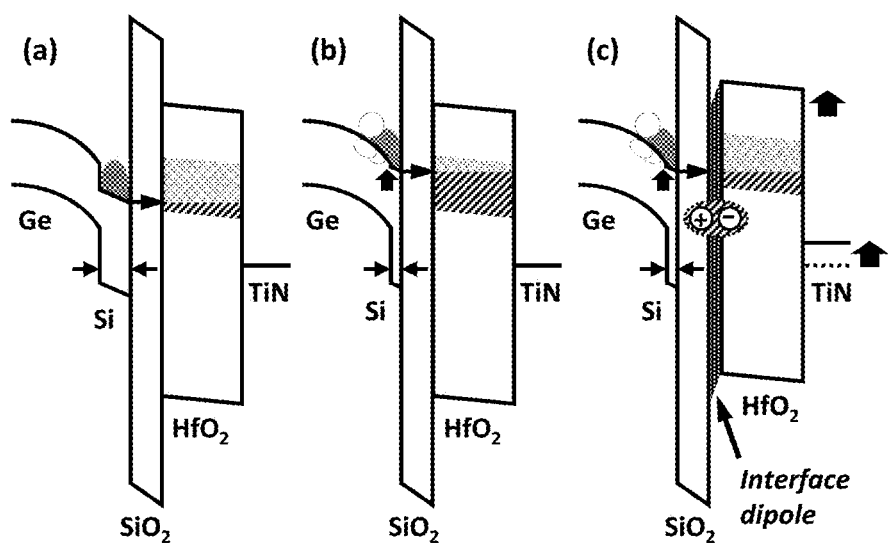
FIGS. 8A-8C schematically shows band diagrams for a FET comprising a gate stack, according to embodiments of the disclosed technology.

Without being bound to any theory, the combined advantage of improved PBTI and high electron mobility is explained by FIGS. 8A-8C. Different band diagrams are shown for gate stacks according the disclosed technology comprising (a) a thick (e.g., more than 0.6 nm, the thickness of the passivation layer after oxidation) passivation layer, (b) a thin (e.g., between 1 and 8 monolayers) passivation layer, and (c) a thin passivation layer and a dielectric capping layer with interface dipole-forming material formed between the high-k dielectric layer 104 and the interfacial dielectric layer 102. For the band diagram, a defect level in the high-k dielectric layer with a localized energy distribution is assumed. When the interface dipole is formed, the energy level changes abruptly at the interface, resulting in the same but energetically misaligned defects in the high-k dielectric layer for the electrons in the channel region. The formation of interface dipole causes significant threshold voltage ($V_{th}$) shift, wherein the $V_{th}$ shift shows discontinuous thickness dependency. To improve PBTI reliability, the interface dipole needs to be the one which causes negative $V_{th}$ and flatband voltage ($V_{FB}$) shift. Also gate leakage current dominated by electron tunneling is reduced by the formation of the interface dipole.

The gate-to-channel capacitance shows a significant reduction of the threshold voltage $V_{th}$ (0.95V for an as-deposited 0.5 nm La PVD layer) by the La induced dipole and a reduction of the gate inversion thickness ($T_{inv}$) thanks to the LaSiO formation having a higher k-value than interfacial $SiO_2$ dielectric layer. The extracted equivalent oxide thickness (EOT) is 1.05 nm, and the $T_{inv}$ extracted at a Vth of +0.6 V is 1.60 nm.

Summarized in TABLE 1 below are experimental results achieved for a FET comprising a gate stack according to embodiments of the disclosed technology. As shown in TABLE 1, the max. Vov projected for 10 years of operation at 125° C. is increased by up to 0.28 V at reduced $T_{inv}$, which is not far from the PBTI reliability target for a 0.5 V-VDD device.

TABLE 1

|  | Gate stack 110 |
| --- | --- |
| Tinv (nm) | 1.5 (at Vth +0.6 V) |
| μ (cm2/Vs) | ~175 |
| Vth (V) | ~0.3 |
| PBTIVov (V) | 0.28 |

The PBTI reliability is improved due to the addition of the La-comprising dielectric capping layer and the induced formation of interface dipoles. As shown by the band diagrams in FIG. 8C, interface dipole changes the amount of accessible defects in the high-k dielectric layer for electrons in the channel region at a given overdrive voltage, which is the difference between the applied gate voltage and the threshold voltage. Further improvement may be obtained by laser annealing (performed in between the step of high-k dielectric layer deposition and the metal gate deposition). Since the laser annealing causes no clear change in PBTI when there is no La-comprising dielectric capping layer, the additional improvement in PBTI reliability is related to the defect passivation in the LaSiO layer. Due to the low thermal budget of the Ge process (as it is a gate-last manufacturing method), there is less La diffusion compared to for example a gate-first Si CMOS process. Hence to maximize the interface dipole formation, the La is deposited immediately on top of the interfacial dielectric layer.

An ALD deposited dielectric capping layer has the advantage of being compatible with sub-1× technology node wherein the pitch becomes very small (smaller than 10 nm) and it becomes difficult to deposit layers with conventional vapor phase deposition techniques. Such FETs are thus compatible with for example three dimensional (3D) devices such as FinFETs or gate-all-around (GAA) FETs. ALD is known as a so called conformal layer, which means the deposition of the layer will follow the contours of the surface on which the layer is deposited (which is not the case for PVD deposited layers).

For the FETs comprising an ALD dielectric capping layer, this ALD dielectric capping layer comprises $La_xO_z$ or $La_xSi_yO_z$ with x, y, z>0. Otherwise said the as-deposited dielectric capping layer is $La_xO_z$ or $La_xSi_yO_z$ and remains this layer material in the final gate stack whereas for a PVD dielectric capping layer the as-deposited dielectric capping layer is La (and becomes a LaSiO layer in the final gate stack).

An ALD dielectric capping layer has the further advantage that no diffusion will occur of the dielectric capping layer with the underlying interfacial dielectric layer. Thereby the gate stack can be more precisely controlled.

Furthermore it has been observed that for an ALD deposited dielectric capping layer 103 the high-k dielectric layer 104 is thinner compared to the gate stacks without dielectric capping layer 103. This is probably due to the inhibition of the ALD growth.

Figure 9A:
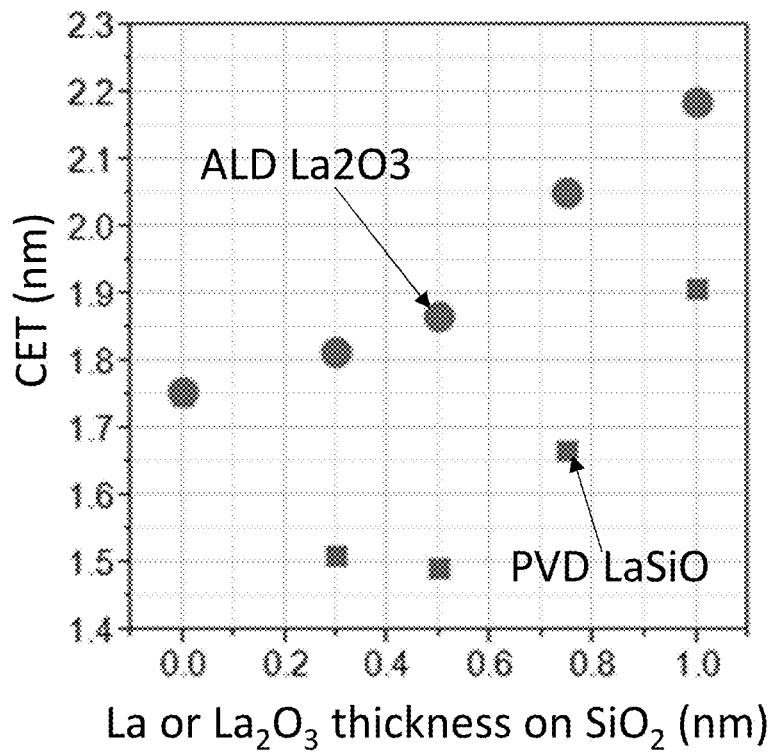
FIGS. 9A-9B show experimental results for the obtained capacitance equivalent thickness (CET) (FIG. 9A) and for the flatband voltage $V_{FB}$ (FIG. 9B) for an ALD-deposited and a PVD-deposited dielectric capping layer, according to embodiments of the disclosed technology.
Figure 9B:
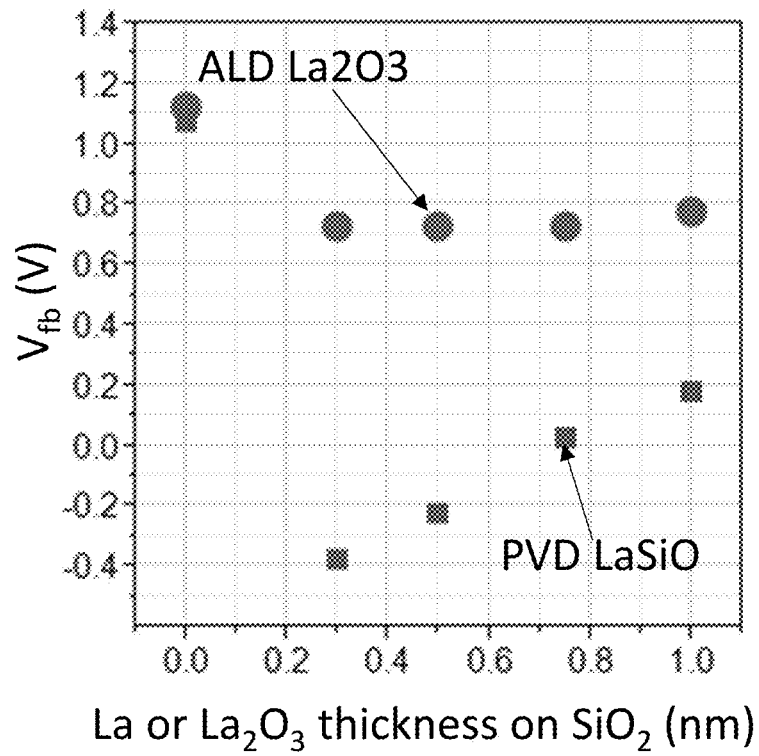

FIGS. 9A-9B shows experimental results for the obtained capacitance equivalent thickness (CET) (FIG. 9A) and for the flatband voltage $V_{FB}$ (FIG. 9B) for a ALD $La_2O_3$ deposited dielectric capping layer (circles) and a PVD La deposited dielectric capping layer (squares). It can be seen that for both CET and VFB the PVD deposited layer seems to be beneficial. The CET reduction is explained due to the LaSiO formation and the significant $V_{FB}$ shift is explained due to the long-range dipole formation. On the other hand for the ALD $La_2O_3$ deposited dielectric capping layer a monotonic increase in CET is observed, indicating that there is no LaSiO formation. The $V_{FB}$ shift is determined by the $La_2O_3/SiO_2$ interface.

Figure 10:
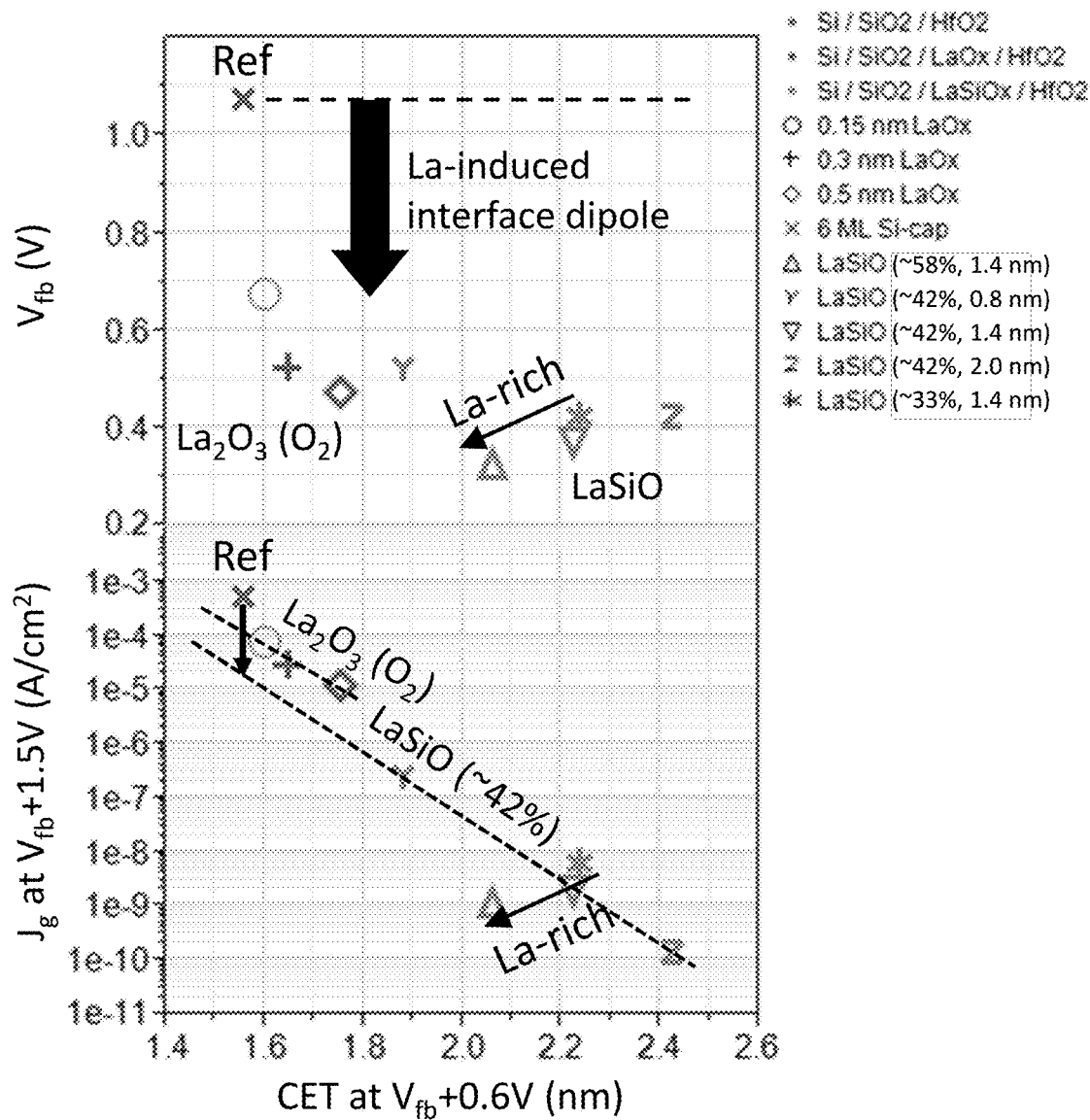
FIG. 10 shows experimental results for ALD deposited dielectric capping layer, according to embodiments of the disclosed technology.

FIG. 10 shows experimental results for ALD deposited $La_2O_3$ dielectric capping layer and ALD deposited LaSiO dielectric capping layer. A significant $V_{FB}$ shift (see top of FIG. 10 $V_{FB}$ versus CET) is observed by inserting $La_2O_3$ and LaSiO which is attributed to the formation of La-induced interface dipole. For different La composition ratio in LaSiO, La-rich LaSiO showed larger $V_{FB}$ shift, which is consistent with the explanation using the dipole.

The effect (merit) of interface dipole is also seen in the gate leakage current (Jg, bottom figure of FIG. 10). For thicker gate dielectric, the gate leakage current is lower. However, it is seen that the Jg trend for different $La_2O_3$ and LaSiO thickness are below the reference without any La. This is explained due to the interface dipole which is shifting the band diagram of high-k gate dielectric as shown in FIG. 8C, which increases the barrier for the electron tunneling from the Ge channel. So, as soon as the interface dipole is formed at the interface between the high-k dielectric layer and the interfacial dielectric layer (high-k/SiO2) interface, this advantage in reducing gate leakage current can be seen.

Figure 11:
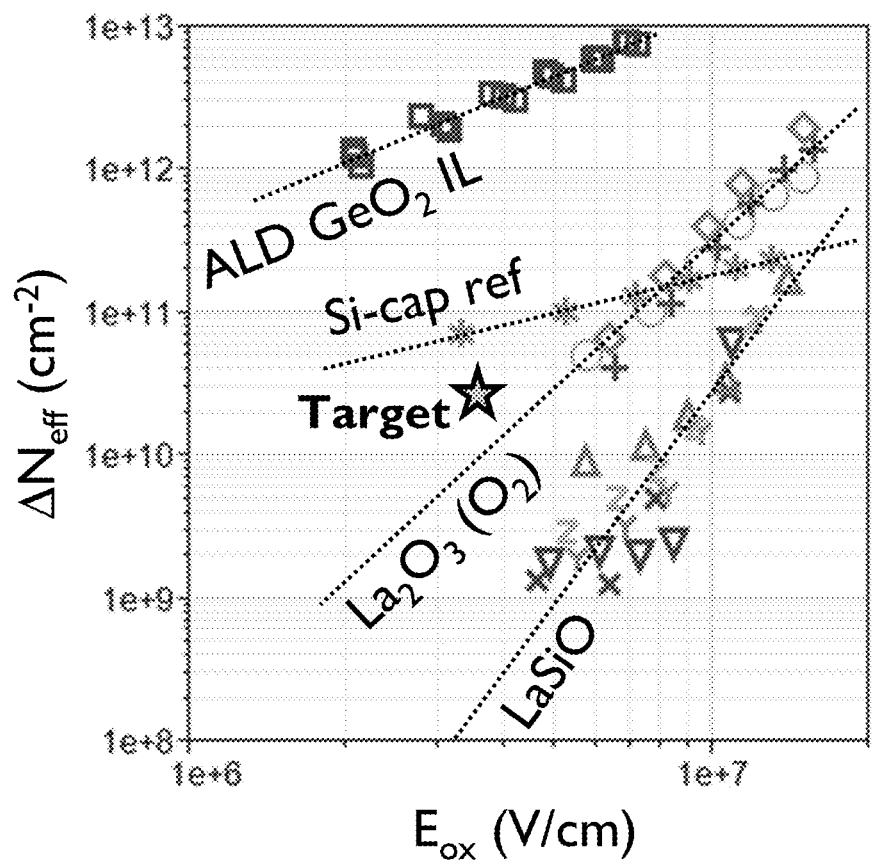
FIG. 11 shows experimental results of the effective oxide trap density as a function of electric field across the oxide for a FET comprising a dielectric capping layer comprising La, according to embodiments of the disclosed technology.

In FIG. 11 shows experimental results of the effective oxide trap density in function of electric field across the oxide. It is estimated from C-V hysteresis measurement and shows lower value at a reasonable Eox (which is about 3.5 MV/cm). The observed steeper voltage acceleration for the case of ALD $La_2O_3$ and LaSiO indicate the energy misalignment between defect level in high-k and electrons in the channel.

The FET further comprises a high-k dielectric layer 104. The high-k dielectric layer may for example comprise $HfO_x$, $HfSiO_x$, HfSiON, $LaO_x$, $ZrO_x$, $ZrSiO_x$, $TaO_x$, AlOx or any combination and may be formed according to well-known techniques for a person skilled in the art such as PVD or ALD.

According to embodiments a laser anneal may be performed after deposition of the high-k dielectric layer 104. It is seen that an anneal of 750 degrees Celsius clearly improves the PBTI reliability further. Also a further reduction of threshold voltage is observed. The obtained maximum overdrive voltage $V_{ov}$ for 10 years was 0.28V at $T_{inv}$ of 1.5 nm and EOT of 0.95 nm, which is close to the target of 0.5 $V_{dd}$ operation.

The FET further comprises a gate metal layer 105. The gate metal layer may for example comprise TiN, TiAl, TaN, TaC, TiC, Ti, Ta, Mo, Ru or W and may be formed according to well-known techniques for a person skilled in the art such as PVD or ALD.

The Si-passivated Ge nFET may be fabricated using a replacement metal gate (RMG) high-k last flow. After the dummy gate removal and pre-cleaning, a thin Si layer is epitaxially grown on the Ge channel with the $Si_3H_8$ precursor at 350 degrees Celsius (° C.). Dry $O_3$ oxidation is then performed at 300° C. followed thereby forming a $SiO_2$ interfacial layer (IL) on the Si cap layer. 0.3-0.5 nm of PVD La is formed on the $SiO_2$ interfacial layer (IL). Laser annealing is then performed at 750° C. Thereafter about 2-4 nm ALD $HfO_2$ is deposited on the stack. A final metal gate is formed on the HfO2 layer with 5 nm ALD TiN and W. After the standard back-end-of-line (BEOL) process, a $H_2$ sintering anneal (400° C., 20 min) to passivate the defects in the $Si/SiO_2$ interface, i.e. dangling bonds may be carried out.

The FET according to embodiments of the invention may include planar or horizontal FET as well as vertical (i.e. three dimensional) FET such as FinFET or gate all around (GAA) FET. In case of vertical devices it can be seen whether the dielectric capping layer is formed by PVD or by ALD, as an ALD layer will be formed conformal to the vertical structure of the vertical device, i.e. following the contours of the underlying layers. For a FinFET for example the dielectric capping layer provided with ALD will also be visible at the sidewalls of the fins whereas for a PVD dielectric capping layer this is not the case.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A field-effect transistor (FET), comprising:
   an active region comprising germanium (Ge); and
   a gate stack formed on the active region, the gate stack comprising:
      a passivation layer formed on the active region and comprising a Si layer having a thickness between 1 and 8 monolayers,
      an interfacial dielectric layer formed on the passivation layer and comprising $SiO_x$, wherein x is greater than 0,
      an $Si/SiO_x$ interface between the passivation layer and the interfacial dielectric layer,
      a dielectric capping layer separately deposited on the interfacial dielectric layer and comprising an interface dipole-forming material,
      a high-k dielectric layer formed on the dielectric capping layer, and
      a gate electrode layer formed on the high-k dielectric layer.

2. The FET according to claim 1, wherein the dielectric capping layer is in physical contact with the interfacial dielectric layer and the high-k dielectric layer.

3. The FET according to claim 1, wherein the interface dipole-forming material comprises a rare earth element.

4. The FET according to claim 3, wherein the rare earth element is selected from the group consisting of lanthanum (La), yttrium (Y), magnesium (Mg), erbium (Er), dysprosium (Dy) and gadolinium (Gd).

5. The FET according to claim 1, wherein the dielectric capping layer is a transition metal oxide layer or a transition metal silicate layer.

6. The FET according to claim 5, wherein the dielectric capping layer comprises $La_xO_z$, where x and z are each greater than 0.

7. The FET according to claim 5, wherein the dielectric capping layer comprises $La_xSi_yO_z$, where x, y and z are each greater than 0.

8. The FET according to claim 1, wherein the thickness of the passivation layer is between 1 and 5 monolayers.

9. The FET according claim 1, wherein the high-k dielectric layer is formed of any of $HfO_x$, $HfSiO_x$, HfSiON, $LaO_x$, $ZrO_x$, $ZrSiO_x$, $TaO_x$, $AlO_x$ or any combination thereof.

10. The FET according to claim 1, wherein the gate electrode layer comprises a metal selected from the group consisting of TiN, TiAl, TaN, TaC, TiC, Ti, Ta, Mo, Ru and W.

11. The FET according to claim 1, wherein the interfacial dielectric layer comprises $SiO_x$ or $SiO_2$, and the dielectric capping layer comprises a lanthanum oxide or a lanthanum silicate.

12. The FET according to claim 1, wherein the FET is a FinFET or a gate all-around (GAA) FET.

13. A method of manufacturing a field-effect transistor (FET), the method comprising:
  providing an active region comprising germanium (Ge);
  forming a gate stack on the active region, comprising:
    forming on the active region a passivation layer comprising a Si layer having a thickness between 1 and 8 monolayers,
    forming on the passivation layer an interfacial dielectric layer comprising $SiO_x$, wherein x is greater than 0, whereby an $Si/SiO_x$ interface is formed between the passivation layer and the interfacial dielectric layer,
    separately depositing on the interfacial dielectric layer a dielectric capping layer comprising an interface dipole-forming material,
    forming on the dielectric capping layer a high-k dielectric layer, and
    forming on the high-k dielectric layer a gate electrode layer.

14. The method according to claim 13, wherein separately depositing the dielectric capping layer comprises depositing by physical vapor deposition (PVD).

15. The method according to claim 13, wherein separately depositing the dielectric capping layer comprises depositing by atomic layer deposition (ALD).

16. The method according to claim 13, wherein forming the passivation layer comprises depositing the passivation layer having a thickness of 1 to 5 monolayers.

17. The method according to claim 16, wherein forming the interfacial dielectric layer comprises partially oxidizing the passivation layer.

18. The method according to claim 17, wherein partially oxidizing the passivation layer comprises reducing the thickness of the passivation layer by more than 50%.

19. The method according to claim 13, further comprising performing a laser anneal after providing the high-k dielectric layer.

20. The method according to claim 13, wherein the method is a gate-last manufacturing method in which a final gate electrode is formed by replacing a sacrificial gate electrode.

21. The FET according to claim 1, wherein the interfacial dielectric layer comprises a thermal $SiO_x$.

22. The method according to claim 13, wherein separately depositing the dielectric capping layer comprises forming an interface dipole by the dielectric capping layer as deposited at an interface between the interfacial dielectric layer and the dielectric capping layer.

23. The FET according to claim 1, wherein the dielectric capping layer comprises LaSiO, the high-k dielectric layer comprises $HfO_2$, and the gate electrode layer comprises TiN.

24. The method according to claim 13, wherein the dielectric capping layer comprises LaSiO, the high-k dielectric layer comprises $HfO_2$, and the gate electrode layer comprises TiN.

* * * * *